US010321602B2

(12) United States Patent
Engelhardt et al.

(10) Patent No.: US 10,321,602 B2
(45) Date of Patent: Jun. 11, 2019

(54) AIR AGITATOR ASSEMBLIES

(71) Applicant: GE Aviation Systems LLC, Grand Rapids, MI (US)

(72) Inventors: Michel Engelhardt, Woodbury, NY (US); Shushanna Rebecca Cherian-Brutus, Port Jefferson Station, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 16/013,460

(22) Filed: Jun. 20, 2018

(65) Prior Publication Data

US 2018/0310433 A1    Oct. 25, 2018

Related U.S. Application Data

(62) Division of application No. 14/514,436, filed on Oct. 15, 2014, now Pat. No. 10,028,408.

(51) Int. Cl.
*H05K 7/20*    (2006.01)

(52) U.S. Cl.
CPC .................. *H05K 7/20172* (2013.01)

(58) Field of Classification Search
CPC ..... F28D 2021/0029; F28D 2021/0028; H01L 23/40; H01L 23/46; H01L 41/311; H01L 23/467; F28F 5/00; F28F 5/02
See application file for complete search history.

(56) References Cited

U.S. PATENT DOCUMENTS

| 5,914,856 | A | 6/1999 | Morton et al. |
|---|---|---|---|
| 6,722,581 | B2 | 4/2004 | Saddoughi |
| 7,688,583 | B1 | 3/2010 | Arik et al. |
| 7,742,299 | B2 | 6/2010 | Sauciuc et al. |
| 7,990,705 | B2 | 8/2011 | Bult et al. |
| 8,006,917 | B2 | 8/2011 | Arik et al. |
| 8,051,905 | B2 * | 11/2011 | Arik .................... H01L 23/4735 165/104.33 |
| 8,120,908 | B2 | 2/2012 | Arik et al. |
| 8,136,767 | B2 | 3/2012 | Cueman et al. |
| 8,308,078 | B2 | 11/2012 | Arik et al. |
| 8,548,289 | B2 | 10/2013 | Selbrede et al. |
| 8,783,893 | B1 | 7/2014 | Seurin et al. |
| 2010/0053891 | A1 * | 3/2010 | Arik ..................... H01L 23/467 361/692 |
| 2010/0054973 | A1 | 3/2010 | Arik et al. |
| 2010/0320362 | A1 | 12/2010 | Alpert et al. |
| 2010/0320877 | A1 * | 12/2010 | Onitsuka ............... H01L 23/055 310/365 |
| 2011/0204409 | A1 | 8/2011 | Sung et al. |
| 2011/0316416 | A1 | 12/2011 | Han et al. |
| 2012/0018537 | A1 | 1/2012 | Arik et al. |

(Continued)

*Primary Examiner* — Keith M Raymond
*Assistant Examiner* — Kamran Tavakoldavani
(74) *Attorney, Agent, or Firm* — McGarry Bair PC

(57) ABSTRACT

An air agitator assembly for use with a heat-emitting object having a contour, the air agitator assembly including a perforated flexible structure having a thermally absorbing first side confronting and spaced from a portion of the heat-emitting object to define an air space there between and a second side opposite the first side and where at least a portion of the first side of the perforated flexible structure has a contour that matches a contour of a corresponding portion of the heat-emitting object.

8 Claims, 5 Drawing Sheets

(56) References Cited

U.S. PATENT DOCUMENTS

| | | |
|---|---|---|
| 2012/0032876 A1 | 2/2012 | Tabe et al. |
| 2012/0170216 A1 | 7/2012 | Arik et al. |
| 2016/0109195 A1 | 4/2016 | Engelhardt et al. |
| 2016/0113145 A1* | 4/2016 | Engelhardt ........ H05K 7/20172 165/287 |

* cited by examiner

AIR AGITATOR ASSEMBLIES

CROSS-REFERENCE TO RELATED APPLICATIONS

This application is a divisional of U.S. application Ser. No. 14/514,440, filed on Oct. 15, 2014, titled "AIR AGITATOR ASSEMBLIES", which is related to U.S. application Ser. No. 14/514,436, filed Oct. 15, 2014, now U.S. Pat. No. 10,028,408, issued on Jul. 17, 2018, titled "AIR AGITATOR ASSEMBLIES", which are hereby expressly incorporated herein by reference in their entirety.

BACKGROUND OF THE INVENTION

Contemporary high-power-dissipating electronics produce heat that requires thermal management to maintain the electronics at a designed working temperature range. Heat must be removed from the electronic device to improve reliability and prevent premature failure of the electronics. Cooling techniques may be used to minimize hot spots.

BRIEF DESCRIPTION OF THE INVENTION

In one aspect, an embodiment of the invention relates to an air agitator assembly for use with a heat-emitting object having a contour, the air agitator assembly including a perforated flexible structure having a thermally absorbing first side confronting and spaced from a portion of the heat-emitting object to define an air space there between and a second side opposite the first side and where at least a portion of the first side of the perforated flexible structure has a contour that matches a contour of a corresponding portion of the heat-emitting object and at least one piezoelectric structure located on the perforated flexible structure and operably coupled to a power source wherein heat emitted from the heat-emitting object is absorbed by the first side and actuation of the at least one piezoelectric structure results in movement of the perforated flexible structure to move the volume of the air located between the hot source and the agitator assembly with the local ambient air.

DESCRIPTION OF EMBODIMENTS OF THE INVENTION

Figure 1A:
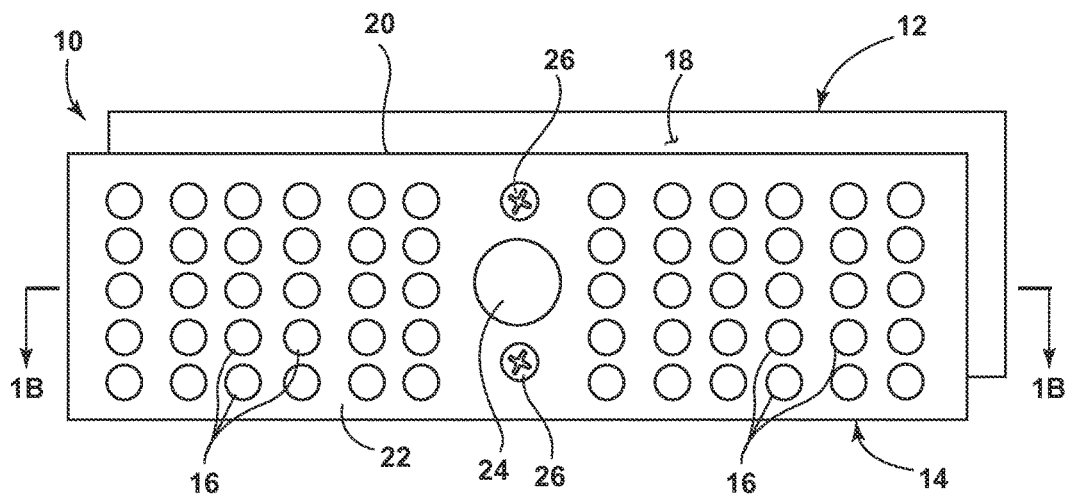
FIGS. 1A-1B schematically illustrate an air agitator assembly according to an embodiment of the invention.

FIG. 1A illustrates an air agitator assembly 10 for use with a heat-emitting object 12. The heat-emitting object 12 may be any heat-emitting object including any electronic heat-emitting component that requires thermal management such as a microprocessor, high heat flux Printed Circuit Boards (PCBs), capacitors, electronics including MOSFETs, and any other device that needs cooling. In the accompanying FIGS. 1 through 4, the heat-emitting object 12 has been illustrated as a PCB for illustrative purposes only. The air agitator assembly 10 may be used with airborne, shipboard, and ground based electronics or any heat dissipating plate and device.

A perforated flexible plate 14 may be included in the air agitator assembly 10 and may be spaced apart from the heat-emitting object 12 and disposed in a generally confronting relationship with the heat-emitting object 12. The perforated flexible plate has been shown partially exploded and partially offset from the heat-emitting object 12 for illustrative purposes. The perforated flexible plate 14 may be formed from any suitable flexible material including aluminum, copper, stainless steel, composite, etc. While the term plate is used, it will be understood that the perforated flexible plate 14 need not have a planar shape and may have any suitable shape including that of a different geometrical shape including a circle or non-standard-geometrical shape. Further, it will be understood that the perforated flexible plate 14 may be of any suitable thickness including that it may have a varied thickness. Perforations 16 in the perforated flexible plate 14 may take any suitable shape and size. Any number of perforations 16 may be included and such perforations 16 may be spaced from each other in any suitable manner.

Figure 1B:
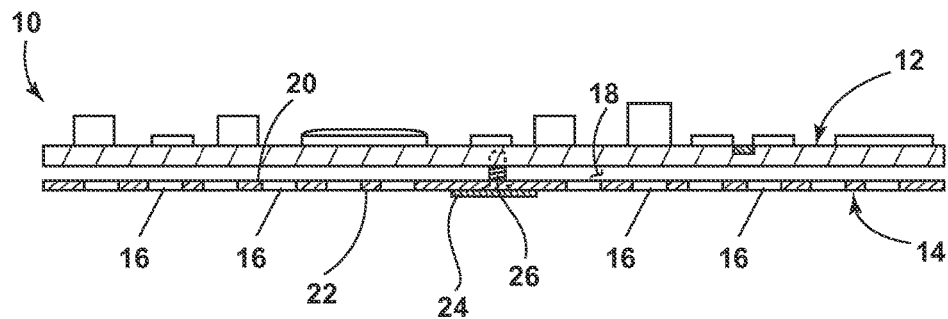

A first side 20 of the perforated flexible plate 14 is illustrated more clearly in FIG. 1B as the side confronting and spaced from a portion of the heat-emitting object 12 to define an air space 18 there between. The first side 20 is thermally absorbing via radiation heat transfer. More specifically, the first side 20 may have an absorptivity that is close to 1.0. By way of non-limiting example, the first side 20 may have an absorption value equal to or greater than 0.95. The absorptivity may be achieved in any suitable manner including having the first side 20 be black in color. As an example, the black color in the paint mix is a polyurethane paint doped with carbon black to obtain the desired high emissivity value.

Conversely, the second side 22, which is opposite the first side 20, of the perforated flexible plate 14 may include a thermally reflective surface such that it is configured to minimize the absorption of heat via radiation. More specifically, the second side 22 may have a reflectivity that is close to one and an absorptivity that is close to 0.0. By way of non-limiting example, the second side 22 may have an absorption value equal to or less than 0.1 and a reflectivity value greater than 0.95. The reflectivity may be achieved in any suitable manner including by having the second side 22 be shiny and light in color. Such a radiation coating may be applied to the perforated flexible plate 14 to minimize the radiative heat transfer from hotter objects and to maximize the heat dissipation from the second surface 22. It is understood that the second surface 22 can have a tailorable emissivity and reflectivity depending on the view factor between hot and colder components within the packaged enclosure.

At least one piezoelectric structure 24, for example a piezoelectric crystal, may be located on the perforated flexible plate 14. In the illustrated example, the piezoelectric structure 24 is located at the center of the perforated flexible plate 14. This need not be the case, and at least one piezoelectric structure 24 may be located elsewhere. The piezoelectric structure 24 may be operably coupled to suitable power sources through connections (not shown). For example, a controllable electric source (not shown) may be utilized such that an alternating voltage of the desired magnitude and frequency may be applied to the piezoelectric structure 24. If multiple piezoelectric structures 24 are utilized, they may be spaced from each other or stacked.

The air agitator assembly 10 may be mounted to the heat-emitting object 12. By way of non-limiting example, the perforated flexible plate 14 is illustrated as being mounted to the heat-emitting object 12 at its center with fasteners 26 in the form of screws. Alternatively, the air agitator assembly 10 may be mounted to a housing or other structure such that it is spaced from the heat-emitting object 12 such that the air agitator assembly 10 is mounted next to the heat-emitting object 12. By way of non-limiting example, it is contemplated that the two may be spaced closely such as within approximately 0.25 to 0.5 inches apart.

During operation, heat emitted from the heat-emitting object 12 is absorbed by the thermally absorbing first side 20 of the perforated flexible plate 14. Such heat travels through the perforated flexible plate 14 by way of conduction and may radiate from the second side 22 into the surrounding environment. Because the perforated flexible plate 14 has one side that is highly thermally absorbing and the other highly reflective, greater heat transfer rates are achieved. It will also be understood that the highly reflective side can be tailored to a highly absorbing side depending on the view factor with cooler components within the enclosure.

Further, at least one piezoelectric structure 24 may be actuated and this results in movement of the perforated flexible plate 14 to move air within the volume of the air space 18. The movement of the perforated flexible plate 14 may cause the air to circulate and agitate. Such agitation movement allows for an increase in the coefficient of convection heat transfer and the circulation allows for cooling of the air agitator assembly 10 that has absorbed part of the heat from the heat-emitting object 12 via radiation heat transfer. More specifically, when a voltage is applied to at least one piezoelectric structure 24 ends of the perforated flexible plate 14 move upwards. When a voltage of opposite polarity is applied, ends of the perforated flexible plate 14 move in the opposite direction. The actuation of the piezoelectric structure 24 causes ends of the perforated flexible plate 14 to flap.

In this manner, the piezoelectric structure 24 converts electrical energy into mechanical work for the perforated flexible plate 14 to oscillate. The perforated flexible plate 14 may be caused to oscillate or flap at any suitable speed including, by way of non-limiting example, at frequencies of approximately 140 Hz. As the perforated flexible plate 14 oscillates, the local boundary layer near the heat-emitting object 12 is agitated and disturbed. The disturbed boundary layer becomes an effective convective heat transfer medium. As the perforated flexible plate 14 oscillates, the boundary layer air that is located next to the heat-emitting object 12 is forced to continuously mix with the cooler air in the surrounding environment due to the air movement in-and-out of the perforations 16 that are located on the perforated flexible plate 14. Further, the second side 22 of the perforated flexible plate 14 reflects heat from other packaged electronic devices that are in view of the heat-emitting object 12 and hotter than the heat-emitting object 12.

Figure 2A:
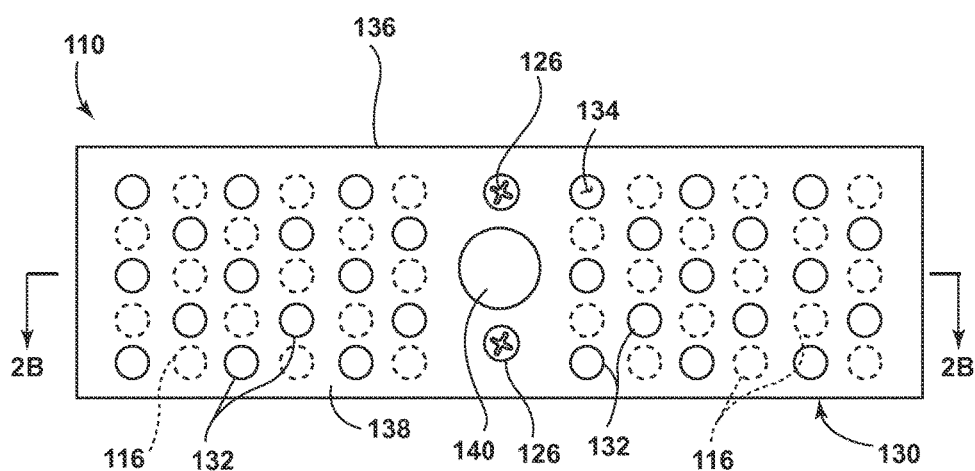
FIGS. 2A-2B schematically illustrate an air agitator assembly according to another embodiment of the invention.
Figure 2B:
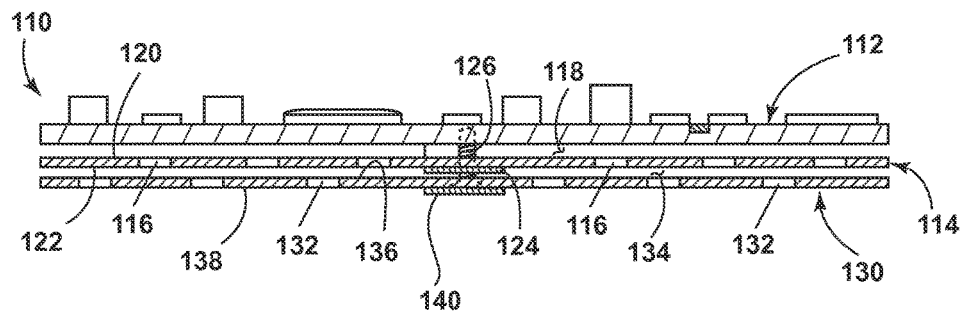

By way of further non-limiting example, FIGS. 2A-2B illustrate an alternative air agitator assembly 110 according to a second embodiment of the invention. The air agitator assembly 110 is similar to the air agitator assembly 10 previously described and therefore, like parts will be identified with like numerals increased by 100, with it being understood that the description of the like parts of the air agitator assembly 10 applies to the air agitator assembly 110, unless otherwise noted.

One difference is that the air agitator assembly 110 includes a second air agitator having a second perforated flexible plate 130 with perforations 132. The second perforated flexible plate 130 is in a confronting and spaced relationship with the second side of the first perforated flexible plate 114 to define an air space 134 there between. The second perforated flexible plate 130 is similar to the first and also includes a thermally absorbing first side 136 and a reflective second side 138 opposite the first side 136 and at least one piezoelectric structure 140 located on the second perforated flexible plate 130. The first perforated flexible plate 114 and the second perforated flexible plate 130 may be arranged in parallel such that they may obtain a desired effective radiation heat transfer. Although this need not be the case, the first perforated flexible plate 114 and the second perforated flexible plate 130 have been illustrated as being arranged such that perforations 116 and 132 in each perforated flexible plate are offset. While only two plates have been illustrated, it is contemplated that any number of plates may be arranged in such a parallel relationship. The first perforated flexible plate 114 and the second perforated flexible plate 130 may be placed at close distance from one another.

The air agitator assembly 110 works similarly to the air agitator assembly 10 described above including that heat emitting from the heat-emitting object 112 is absorbed by the first side 120 of the first perforated flexible plate 114 and heat emitting from the second side 122 of the first perforated flexible plate 114 is absorbed by the first side 136 of the second perforated flexible plate 130. Further, actuation of piezoelectric structures 124 and 140 results in movement of the corresponding first perforated flexible plate 114 and the corresponding second perforated flexible plate 130 to draw air in, push out the drawn in air such that the heat-emitting object 112 is cooled by the airflows and air movement created. It is contemplated that the piezoelectric structures 124, 140 of the first perforated flexible plate 114 and the second perforated flexible plate 130, respectively, are configured to be actuated simultaneously and may utilize the same power source and/or controller. Alternatively, they may be actuated separately and may utilize separate power sources and/or controllers.

Both the first perforated flexible plate 114 and the second perforated flexible plate 130 act to disturb the boundary layer of air along the heat-emitting object 112. Further, both the first perforated flexible plate 114 and the second perforated flexible plate 130 act as a radiation heat shield. Because the perforations 116 and 132 are offset they occult the view factor between the heat-emitting object 112 and any higher heat-emitting components that are located nearby.

Figure 3:
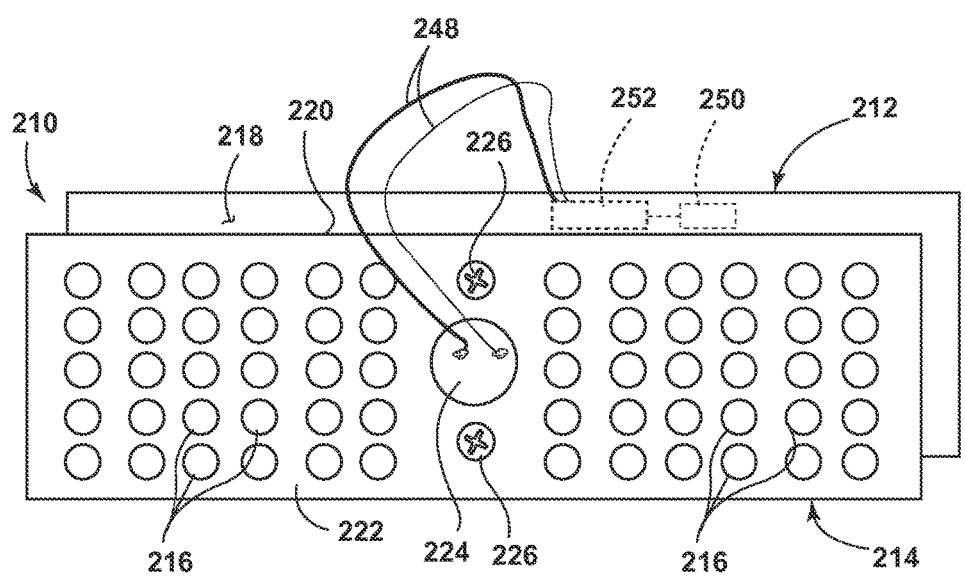
FIG. 3 is a partially exploded view of an air agitator assembly according to yet another embodiment of the invention.

By way of further non-limiting example, FIG. 3 illustrate an alternative air agitator assembly 210 according to a third embodiment of the invention. The air agitator assembly 210 is similar to the air agitator assembly 10 previously described and therefore, like parts will be identified with like numerals increased by 200, with it being understood that the description of the like parts of the air agitator assembly 10 applies to the air agitator assembly 210, unless otherwise noted.

One difference is that connections 248 are illustrated as coupling the piezoelectric structure 224 to a power source 252 located directly on the perforated flexible plate 214. Further, a controller 250 is illustrated as being included on the perforated flexible plate 214. The controller 250 may be configured to control actuation of the power source 252 and therefore the piezoelectric structure 224. The controller 250 may be any suitable type of controller including a Proportional Integral Differential (PID) controller or an on/off controller. During operation, the controller 250 may allow the air agitator assembly 210 to turn-off during low temperature operation, such as by way of example below 20° C., to increase the reliability of the air agitator assembly 210.

Figure 4:
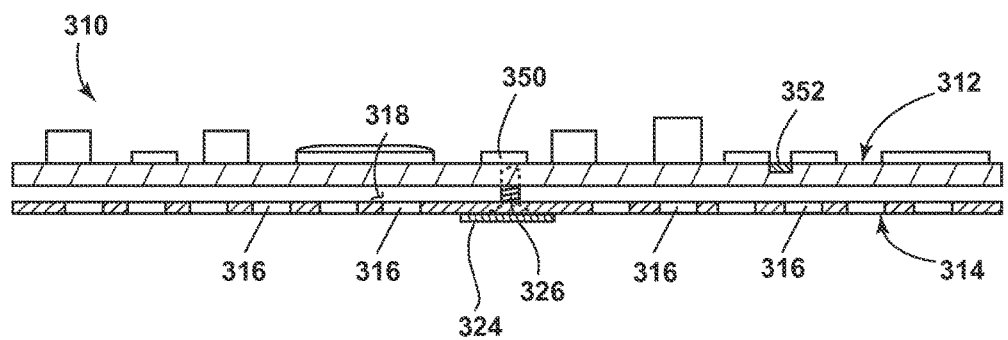
FIG. 4 is a cross-sectional view of an air agitator assembly according to another embodiment of the invention.

By way of further non-limiting example, FIG. 4 illustrates an alternative air agitator assembly 310 according to a fourth embodiment of the invention. The air agitator assembly 310 is similar to the air agitator assembly 210 previously described and therefore, like parts will be identified with like numerals increased by 100, with it being understood that the description of the like parts of the air agitator assembly 210 applies to the air agitator assembly 310, unless otherwise noted.

One difference is that power source for the piezoelectric structure 324 is not illustrated on the heat-emitting object 312. While it may be located on the heat-emitting object 312 it may also be located elsewhere. Further, while the controller 350 has been illustrated as being coupled to the heat-emitting object 312 it may also be located elsewhere. Another difference is that a temperature-measuring device 352 has been illustrated as being included on the heat-emitting object 312. Such a temperature-measuring device 352 may be considered a part of the air agitator assembly 310 regardless of its location. The temperature-measuring device 352 may provide a temperature signal to the controller 350 such that the air agitator assembly 310 may be controlled based on a temperature of the heat-emitting device 312 or the air surrounding it. Any suitable temperature-measuring device 352 may be utilized including a thermocouple.

Again the controller 350 may be any suitable type of controller. By way of non-limiting example, when an on/off controller is used with the integrated temperature-measuring device 352, the piezoelectric structure 324 may be activated when the allowable hot temperature is reached. For example, such a hot temperature may be, for exemplary purposes, 70° C. Alternatively, when the temperature is detected and sent to the controller 350 it is between a set hysteresis loop, as an example 20° C. to 70° C., the piezoelectric structure 324 is controlled to be either on or off. In this mode, the air agitator assembly 310 is considered in the hysteresis hot or cold mode, respectively. The hysteresis mode occurs either during a decrease in temperature from its turn-on set point or an increase in temperature from its turn-off set point. When the temperature is below it lowest set point, the power to the piezoelectric structure 324 is off. If a PID type controller is used, the hysteresis loop may be replaced by a fine temperature control with a higher tolerance.

Figure 5A:
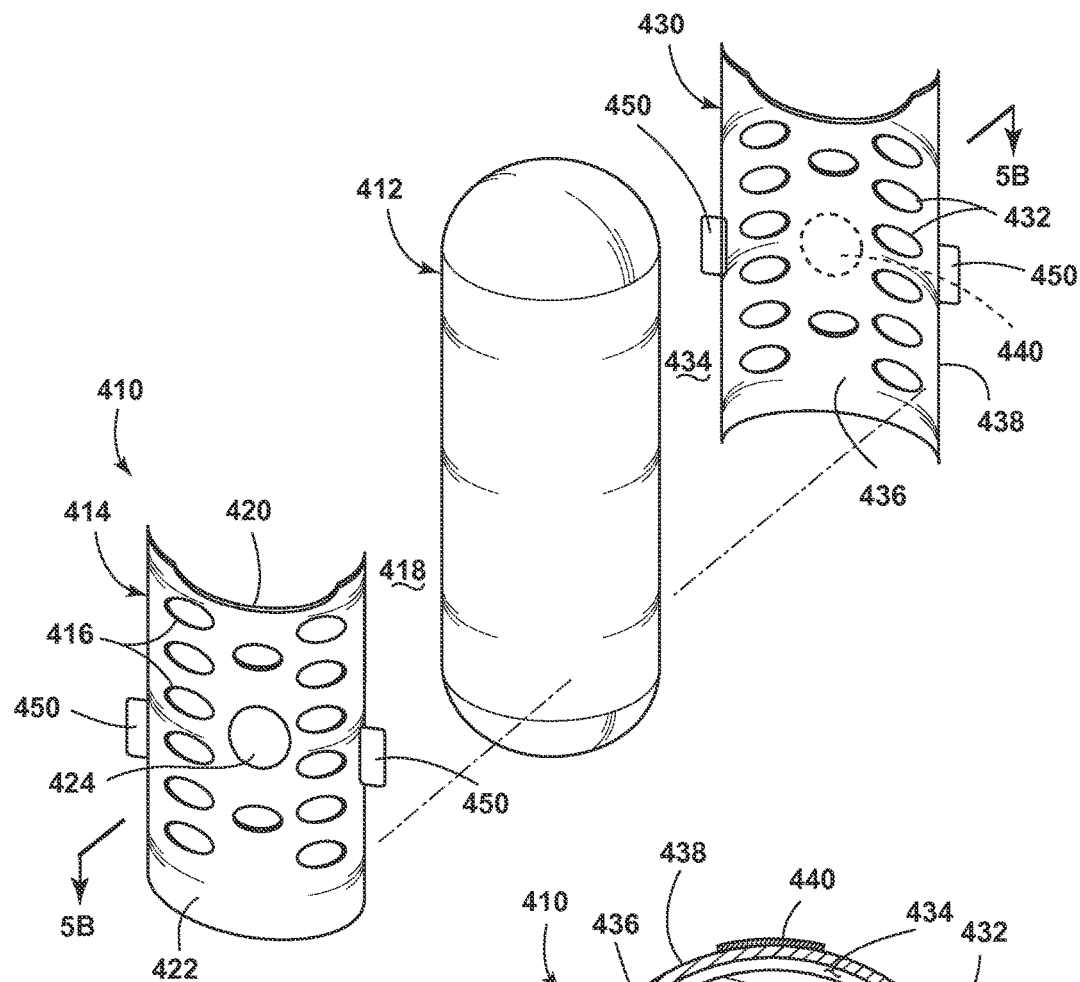
FIG. 5A is an exploded perspective view of an air agitator assembly according to another embodiment.
Figure 5B:
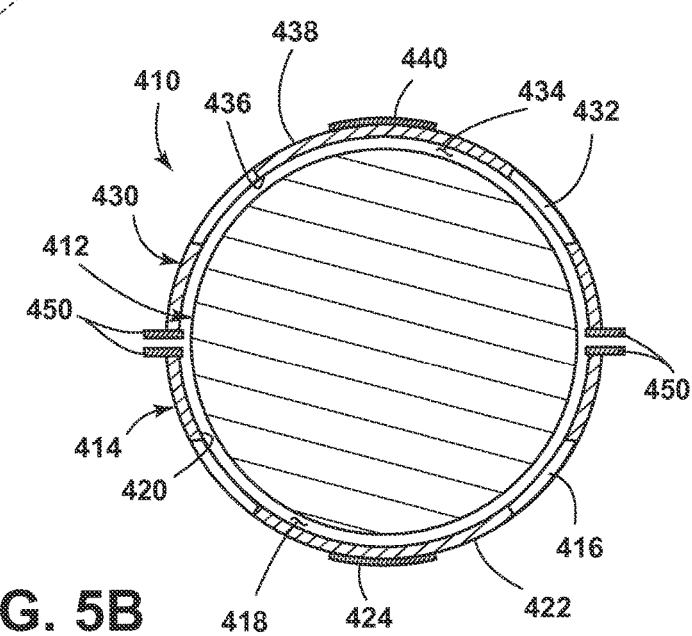
FIG. 5B is a cross-sectional view of the assembled air agitator assembly of FIG. 5A.

By way of further non-limiting example, FIGS. 5A-5B illustrate an alternative air agitator assembly 410 according to a fifth embodiment of the invention. The air agitator assembly 410 is similar to the air agitator assembly 10 previously described and therefore, like parts will be identified with like numerals increased by 400, with it being understood that the description of the like parts of the air agitator assembly 10 applies to the air agitator assembly 410, unless otherwise noted.

One difference is that the air agitator assembly 410 is illustrated as being used with a heat-emitting object 412 that has a contour (i.e. is not flat). For example, such a heat-emitting object 412 may be a capacitor. Further, while the perforated flexible structure 414 may include a thermally absorbing first side 420 confronting and spaced from a portion of the heat-emitting object 412 to define an air space 418 there between and a reflective second side 422 unlike the earlier embodiments the perforated flexible structure 414 has at least a portion of the first side 420 that has a contour that matches a contour of a corresponding portion of the heat-emitting object 412. In the illustrated example, the first side 420 is rounded to better match the cylindrical shape of the heat-emitting object 412. It will be understood that the contoured perforated flexible structure 414 may have any suitable shape and may be contoured in any suitable manner depending on the shape of the heat-emitting object. For example, the flexible structure may merely be shaped or bent plate or structure. Alternatively, it is contemplated that a thickness of the flexible structure may be varied such that the first side 420 of the perforated flexible structure 414 has a contour that matches the contour of the corresponding portion of the heat-emitting object 412.

Further, the air agitator assembly 410 includes a second perforated flexible structure 430 with perforations 432. The second perforated flexible structure 430 is in a confronting and spaced relationship with a second side of the heat-emitting object 412 to define an air space 434 there between. The second perforated flexible structure 430 is similar to the first perforated flexible structure 414 and also includes a thermally absorbing first side 436 and a reflective second side 438 opposite the first side 436 and at least one piezoelectric structure 440 located on the second perforated flexible structure 430. The first perforated flexible structure 414 and the second perforated flexible structure 430 may be joined via portions 450 including that a screw of other fastener may be utilized to fasten the portions 450 together. As illustrated in FIG. 5B, the first perforated flexible structure 414 and the second perforated flexible structure 430 may be mounted together such that they do not touch the heat-emitting object 412.

The air agitator assembly 410 works similarly to the air agitator assembly 10 described above including that heat emitting from the heat-emitting object 412 is absorbed by the first side 420 of the first perforated flexible structure 414 and the first side 436 of the second perforated flexible structure 430. Further, actuation of piezoelectric structures 424 and 440 results in movement of the corresponding first perforated flexible structure 414 and the corresponding second perforated flexible structure 430 to create air movement such that the heat-emitting object 112 is cooled by the airflows and air movement created. It is contemplated that the piezoelectric structures 424, 440 of the first perforated flexible structure 414 and the second perforated flexible structure 430, respectively, are configured to be actuated simultaneously or in series or based on the same or different detected temperatures. Further, they may utilize the same power source and/or controller or utilize separate power sources and/or controllers.

In this manner both the first perforated flexible structure 414 and the second perforated flexible structure 430 act to disturb the boundary layer of air around the heat-emitting object 412. Further, both the first perforated flexible structure 414 and the second perforated flexible structure 430 act as a radiation heat shield. It will be understood that an air agitator assembly having a contoured may be utilized with any number of perforated flexible structures over any number of sides of any heat-emitting object. Including that only a single perforated flexible structure may be utilized. Further still this may include utilizing perforated flexible structures in parallel with each other as disclosed in embodiments above. Further still, the air agitator assembly 410 may be used with one or more controllers, power sources, and/or temperature sensors.

The embodiments described above provide a variety of benefits including that such air agitator assemblies solve the thermal management problem of cooling electronic devices with high power dissipations, with local hot spots, or electronic components that require a uniform temperature distribution. The effective convection, provided by the oscillation of the plate and the perforations, and radiation, provided by the highly absorbing and reflective surfaces, heat transfer coefficient is expected to be approximately five times greater than natural convection. The above-described embodiments couple convection and radiation heat transfer to provide better cooling. Further, the above-described embodiments are easy to manufacture, have low electrical draw, low volume, are lightweight, and increase component reliability. Typically, standard fans are used for convection cooling in aircrafts; however, they are heavier and at times the air circulation from fans is blocked due to the high-density packaging. The above-described embodiments significantly improve cooling because the air movement is near the boundary layer of the heat-emitting object as opposed to having the air travel through a tortuous path to get to the object. Further still, depending on the attachment method, the air agitator assembly may provide additional structural integrity to the component to be cooled while it is under vibration and shock environments.

To the extent not already described, the different features and structures of the various embodiments may be used in combination with each other as desired. Some features may not be illustrated in all of the embodiments, but may be implemented if desired. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best implementation, to enable any person skilled in the art to practice the invention, including making and using the devices or systems described and performing any incorporated methods presented. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An air agitator assembly for use with a heat-emitting object having at least a first side and a second side, comprising: a first air agitator having a first perforated flexible structure having a thermally absorbing first side spaced from a portion of the first side of the heat-emitting object to define a first air space there between and a second side opposite the first side of the first perforated flexible structure, where at least a portion of the first side of the first perforated flexible structure has a non-flat contour that matches a non-flat contour of a corresponding portion of the first side of the heat-emitting object, and at least one piezoelectric structure located on the first perforated flexible structure; and a second air agitator having a second perforated flexible structure having a thermally absorbing first side spaced from a portion of the second side of the heat-emitting object to define a second air space there between and a second side opposite the first side of the second perforated flexible structure, where at least a portion of the first side of the second perforated flexible structure has a non-flat contour that matches a non-flat contour of a corresponding portion of the second side of the heat-emitting object, and at least one piezoelectric structure located on the first perforated flexible structure; wherein heat emitted from the heat-emitting object is absorbed by the first side of the first perforated flexible structure and the first side of the second perforated flexible structure and actuation of piezoelectric structures results in movement of the corresponding first perforated flexible structure and the corresponding second perforated flexible structure to move the air such that the heat-emitting object is cooled by airflows created.

2. The air agitator assembly of claim 1 wherein the piezoelectric structures of the first perforated flexible structure and the second perforated flexible structure are configured to be actuated simultaneously.

3. The air agitator assembly of claim 1 wherein the first side of the first perforated flexible structure and the first side of the second perforated flexible structure have absorption values greater than 0.95.

4. The air agitator assembly of claim 1 wherein the second side of the first perforated flexible structure and the second side of the second perforated flexible structure have thermally reflective surfaces such that they are both configured to transfer heat via radiation.

5. The air agitator assembly of claim 4 wherein the second side of the first perforated flexible structure and the second side of the second perforated flexible structure have a reflectivity value greater than 0.95.

6. The air agitator assembly of claim 1, further comprising a controller configured to control actuation of the piezoelectric structures.

7. The air agitator assembly of claim 6, further comprising at least one temperature-measuring device providing at least one temperature signal to the controller.

8. The air agitator assembly of claim 1 wherein the piezoelectric structures of the first perforated flexible structure and the second perforated flexible structure are operably coupled to at least one power source.

* * * * *